(12) United States Patent
Aschwanden

(10) Patent No.: US 10,838,115 B2
(45) Date of Patent: Nov. 17, 2020

(54) OPTICAL SYSTEM COMPRISING A CURVED IMAGE SENSOR

(71) Applicant: OPTOTUNE CONSUMER AG, Dietikon (CH)

(72) Inventor: Manuel Aschwanden, Allenwinden (CH)

(73) Assignee: OPTOTUNE AG, Dietikon (CH)

(*) Notice: Subject to any disclaimer, the term of this patent is extended or adjusted under 35 U.S.C. 154(b) by 95 days.

(21) Appl. No.: 16/068,112

(22) PCT Filed: Jan. 4, 2017

(86) PCT No.: PCT/EP2017/050136
§ 371 (c)(1),
(2) Date: Jul. 4, 2018

(87) PCT Pub. No.: WO2017/118656
PCT Pub. Date: Jul. 13, 2017

(65) Prior Publication Data
US 2019/0018169 A1    Jan. 17, 2019

(30) Foreign Application Priority Data
Jan. 4, 2016 (EP) .................................. 16150108

(51) Int. Cl.
G02B 3/14       (2006.01)
G02B 7/02       (2006.01)
G02F 1/29       (2006.01)
G02B 26/00      (2006.01)
H04N 5/369      (2011.01)
H01L 27/146     (2006.01)
H04N 5/225      (2006.01)

(52) U.S. Cl.
CPC ............... G02B 3/14 (2013.01); G02B 7/028 (2013.01); G02B 26/005 (2013.01); G02F 1/29 (2013.01); H01L 27/14607 (2013.01); H01L 27/14625 (2013.01); H04N 5/2254 (2013.01); H04N 5/3696 (2013.01)

(58) Field of Classification Search
CPC ........ G02B 3/14; G02B 7/028; G02B 26/005; G02F 1/29; H01L 27/14607; H01L 27/14625; H04N 5/2254; H04N 5/3696
USPC .................................................. 359/665, 666
See application file for complete search history.

(56) References Cited

U.S. PATENT DOCUMENTS 6,791,072 B1    9/2004  Prabhu
8,064,142 B2 *  11/2011 Batchko .................. G02B 3/14
                                                      359/665

(Continued)

FOREIGN PATENT DOCUMENTS

WO    2010103037    9/2010
WO    2015024136    2/2015

Primary Examiner — James R Greece
(74) Attorney, Agent, or Firm — JMB Davis Ben-David

(57) ABSTRACT

The invention relates to an optical system (1) comprising: a first focus tunable lens (10), a curved image sensor (30) configured to receive light (L) focused by the first focus tunable lens (10); an optical path (P) extending through the first focus tunable lens and to the curved image sensor; wherein the optical system (1) is configured to tune the focal length of the first focus tunable lens (10) by applying an electrical signal to the first focus tunable lens (10) such that light (L) traversing said optical path (P) is focused onto the image sensor (30).

13 Claims, 10 Drawing Sheets

(56) References Cited

U.S. PATENT DOCUMENTS

| | | |
|---|---|---|
| 9,086,558 B2 | 7/2015 | Chen et al. |
| 9,442,285 B2 * | 9/2016 | Rogers .................. G02B 27/28 |
| 2008/0144186 A1 * | 6/2008 | Feng ........................ G02B 3/14 |
| | | 359/666 |
| 2011/0038028 A1 * | 2/2011 | Dharmatilleke ......... G02B 3/14 |
| | | 359/290 |
| 2012/0147207 A1 | 6/2012 | Itonaga |
| 2012/0261551 A1 | 10/2012 | Rogers et al. |
| 2013/0063634 A1 | 3/2013 | Yamano |
| 2014/0004644 A1 | 1/2014 | Roy et al. |
| 2014/0049683 A1 * | 2/2014 | Guenter ................. H04N 5/262 |
| | | 348/360 |
| 2014/0253677 A1 | 9/2014 | Chen et al. |
| 2016/0241840 A1 * | 8/2016 | Kim .................. G02B 27/0075 |

* cited by examiner

OPTICAL SYSTEM COMPRISING A CURVED IMAGE SENSOR

CROSS-REFERENCE TO RELATED APPLICATIONS

This is the U.S. National Stage of International Application No. PCT/EP2017/050136 filed on Jan. 4, 2017, which was published in English under PCT Article 21(2), which in turn claims priority to European Patent Application No. European Patent Application No. 16150108.5 filed Jan. 4, 2016.

The invention relates to an optical system comprising an image sensor, e.g. a camera.

Such systems are known for instance from US20140004644A1, U.S. Pat. No. 6,791,072 B1, US20120147207A1, and U.S. Pat. No. 9,086,558 B2.

The problem underlying the current invention is to provide an optical system of the afore-mentioned kind that is low cost, compact and particularly comprises autofocus capability.

This problem is solved by a lens having the features of claim 1. Preferred embodiments of the present invention are stated in the sub claims and are described below.

According to claim 1 an optical system is disclosed which comprises:
  a first focus tunable lens (i.e. a first lens configured to automatically tune its focal length),
  a curved image sensor configured to receive light focused by the first focus tunable lens;
  an optical path extending through the first focus tunable lens and to the curved image sensor;
  wherein the optical system is configured to tune the focal length of the first focus tunable lens by applying an electrical signal to the first focus tunable lens such that light traversing said optical path is focused (e.g. directly) onto the image sensor.

In the context of the present invention, a curved image sensor is an image sensor that comprises a detecting surface which is configured to receive light that is to be detected by the image sensor, wherein said surface is curved, particularly spherically curved. Particularly, said surface/the image sensor comprises a concave (curvature), i.e. the center of the image sensor is further away from the first or second focus tunable lens than the edge of the image sensor when measured along the optical axis.

Advantageously, the present invention utilizes a curved image sensor that merely requires one lens to focus a wide field of view on the entire sensor. In contrast thereto, a flat image sensor requires multiple lenses to correct for chromatic and spherical aberrations. Thus, using a curved image sensor in conjunction with a focus tunable lens allows a low cost and compact design of an optical device (such as a camera) that particularly comprises an autofocus function due to the focus adjustability of the employed focus tunable lens. Furthermore, such a setup also maintains a constant F-Number whereas a system with moving lenses requires more space and has a variable F-Number.

Particularly all kinds of first (and second) focus tunable lenses can be used with the invention. According to an embodiment, the first (or second) focus tunable lens comprises a transparent lens body defining a volume which is completely filled with a transparent filler material (e.g. a transparent liquid), wherein the lens body further comprises transparent and elastically deformable membrane and a lens shaping element that contacts the membrane and defines an area of said membrane, which area has an adjustable curvature for adjusting the focal length of the lens.

Here, according to an embodiment, the first (or second) focus tunable lens comprises an actuator that is configured to change said curvature so as to tune the focal length of the first (or second) tunable length. For instance the actuator may act on lens shaping element, on the membrane, or on the lens body in order to change the curvature of said area of the membrane (which area is also denoted as optically active area). Other actuation principles may also be used (see also below).

Particularly, the membrane can be made of at least one of the following materials: a glass, a polymer, an elastomer, a plastic or any other transparent and stretchable or flexible material. For example, the membrane may be made of a silicone-based polymer such as poly(dimethylsiloxane) also known as PDMS or a polymer material such as polyurethanes or a biaxially-oriented polyethylene terephtalate (e.g. "Mylar").

Further, said filler material or liquid may be a silicone oil or a fluorinated polymer.

According to an embodiment of the present invention, the optical system further comprises a second focus tunable lens (i.e. a second lens configured to automatically tune its focal length), wherein the second focus tunable lens is arranged in said optical path, and wherein the second focus tunable lens is configured to operate with the first focus tunable lens to focus light traversing the optical path onto the image sensor.

Further, according to an embodiment of the present invention, the first focus tunable lens and the second focus tunable lens each comprise one of the following components configured for tuning the respective focal length: an electrostatic actuator which uses Coulomb forces to move fluid and therefore deform the shape of the lens, an electromagnetic actuator which uses Lorenz forces to move fluid and therefore to deform the shape of the lens, a magnetostrictive actuator which expands or contracts depending on the magnetic flux flowing through it, a piezo motor, a piezo actuator, a stepper motor, an electroactive polymer actuator such as a dielectric elastomer actuator.

Further, according to an embodiment of the present invention, the first focus tunable lens comprises a lens body (see also above) arranged in the optical path for refracting light passing through the lens body, wherein said lens body comprises at least one surface arranged in said optical path, which at least one surface is configured to change its shape, for example from a concave shape to a convex shape or vice versa for tuning the focal length of the first lens.

Further, according to an embodiment of the present invention, the second focus tunable lens comprises a lens body arranged in the optical path for refracting light passing through the lens body, wherein said lens body comprises at least one surface arranged in said optical path, which at least one surface is configured to change its shape, for example from a convex shape to a concave shape or vice versa for tuning the focal length of the second lens.

Further, according to an embodiment of the present invention, the optical system further comprises at least one first corrective lens arranged in the optical path, which at least one first corrective lens is non-deformable and comprises a fixed position with respect to the image sensor and is made out of a rigid material, and wherein the at least one first corrective lens is configured to correct for one of monochromatic aberrations, spherical aberrations, polychromatic aberrations or other aberrations. Here and in the following, non-deformable means that the lens is not configured to tune its focal length by changing its geometrical shape or refractive index, but comprises a constant shape and refractive index owing the respective lens a fixed focal length.

Further, according to an embodiment of the present invention, the optical system further comprises a second corrective lens arranged in the optical path, which second corrective lens is non-deformable and comprises a fixed position with respect to the image sensor and is made out of a rigid material, and wherein the second corrective lens is arranged between the curved sensor and the first tunable lens having said tunable focal length, wherein preferably the first focus tunable lens is arranged closer to the image sensor than the second tunable lens.

Further, according to an embodiment of the present invention, the first focus tunable lens comprises a membrane having a deformable portion, a transparent filler material (e.g. a transparent liquid, see above) adjacent said membrane, and a corrective lens comprising a fixed position with respect to the image sensor.

Further, according to an embodiment of the present invention, the corrective lens contacts the filler material of the first focus tunable lens in a region where the light passes through the first tunable lens along said optical path, and is particularly configured to correct monochromatic or polychromatic aberrations.

Further, according to an embodiment of the present invention, the corrective lens is constructed from a rigid material, such as a glass, a plastic or a polymer (these materials may also be used for the other corrective lenses described herein).

Further, according to an embodiment of the present invention, the first focus tunable lens is a liquid crystal based focus tunable lens.

Further, according to an embodiment of the present invention, the first focus tunable lens is a electrowetting based focus tunable lens.

Further, according to an embodiment of the present invention, the first focus tunable lens is an acoustic modulation based focus tunable lens.

Further, according to an embodiment of the present invention, the first focus tunable lens is an adjustable Fresnel lens.

Further, according to an embodiment of the present invention, the first focus tunable lens comprises a piezo actuator for tuning the focal length of the first focus tunable lens, an (e.g. glass) membrane and a deformable polymer layer.

Further, according to an embodiment of the present invention, the first focus tunable lens has a thermal compensation means being configured to minimize thermal drift of the focal length of the first focus tunable lens.

Further, according to an embodiment of the present invention, the optical system is configured to adjust the focal length of the first focus tunable lens (or any other focus tunable lens such as said second lens) using an algorithm which uses calibration data, temperature (e.g. the temperature of the respective focus tunable lens) or another feedback signal to set a corresponding value of a control signal to achieve the desired focal length.

The present invention can be used in various fields among them mobile phones, machine vision, digital still cameras, OCT, ophthalmology equipment, fundus cameras, medical equipment, time of flight cameras, microscopes, endoscopes, surveillance cameras, automotive, robot cams, ADAS, range finder, bar code readers etc.

Further explanations and other aspects and features of the present invention will be given below.

The invention will be better understood and objects other than those set forth above will become apparent when consideration is given to the following detailed description thereof. Such description makes reference to the annexed drawings, wherein.

Figure 1:
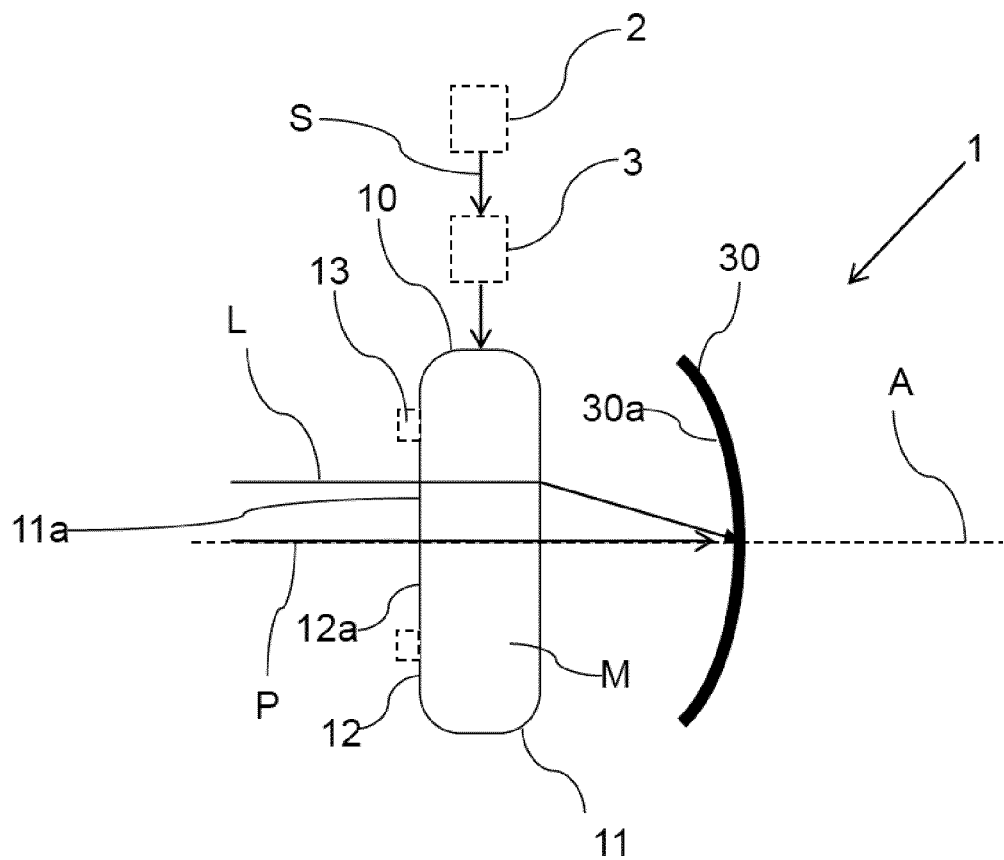
FIG. 1 shows a schematic representation of an optical system according to the invention comprising a first focus tunable lens and a curved image sensor.

FIG. 1 shows an optical system 1 according to the invention which comprises a first focus tunable lens 10, a curved image sensor 30, e.g. a thinned CMOS sensor mounted on a curved metal mount, configured to receive light L focused by the first focus tunable lens 10, an optical path P extending through the first focus tunable lens 10 and to the curved image sensor, wherein the optical system 1 is configured to tune the focal length of the first focus tunable lens 10 by applying an electrical signal S to the first focus tunable lens 10 such that light L traversing said optical path P is focused onto the image sensor 30.

Particularly, said signal S is generated by a control unit 2 and applied to an actuator means (e.g. one of the actuators described herein) 3 that is configured to interact with the first focus tunable lens 10 so as to tune the focal length of the first focus tunable length, i.e., change the focal length to a desired value. In this way, light L can be focused by said first lens 10 directly onto a concavely curved detecting surface 30a of the image sensor 30. The sensor 30, namely its surface 30a, faces the first focus tunable lens 10 along an optical axis A or along said optical path P and the center of the image sensor is further away from the first focus tunable lens than the edge of the image sensor when measured along the optical path P.

According to an embodiment the first focus tunable lens 10 in FIG. 1 comprises a lens body 11 arranged in the optical path P for refracting light L passing through the lens body 11, wherein said lens body 11 comprises at least one surface 11a arranged in said optical path P, which at least one surface 11a is configured to change shape for example from a concave shape to a convex shape or vice versa. Alternatively, the lens body 11 can also change the local value of the refractive index In all embodiments described herein, the first focus tunable lens 10 (as well as any other focus tunable lens of the optical system 1 of the invention) can be a so called fluid or liquid lens 10. Here, the first focus tunable lens 10 may comprise a transparent lens body 11 defining a volume which is completely filled with a transparent filler material (e.g. a transparent liquid) M, wherein the lens body 11 further comprises transparent and elastically deformable membrane 12 and a lens shaping element 13 that contacts the membrane 12 and defines an area 12a of said membrane 12, which area 12a has an adjustable curvature for adjusting the focal length of the first lens 10. Here, furthermore, the first focus tunable lens 10 may comprise an actuator 3 that is configured to change said curvature so as to tune the focal length of the first tunable length 10. For instance, the actuator 3 may act on the lens shaping element 13, on the membrane 12 (e.g. outside said area 12a), or on the lens body 11 in order to change the curvature of said area 12a of the membrane 12 (which area is also denoted as optically active area). Here, particularly the fact is used that the filler material M is essentially incompressible and said area 12a of the elastically deformable membrane 12 is deformed when pressure is exerted onto the transparent lens body 11 or the material therein. However, other actuator means or principles including shape changing or refractive index changing methods may also be used in the embodiment of FIG. 1 and in the other embodiments described herein (see also below).

FIGS. 14 to 19 show further possible embodiments of the first focus tunable lens 10 (and of the second focus tunable lens) that may be used in the embodiments described herein.

Figure 14:
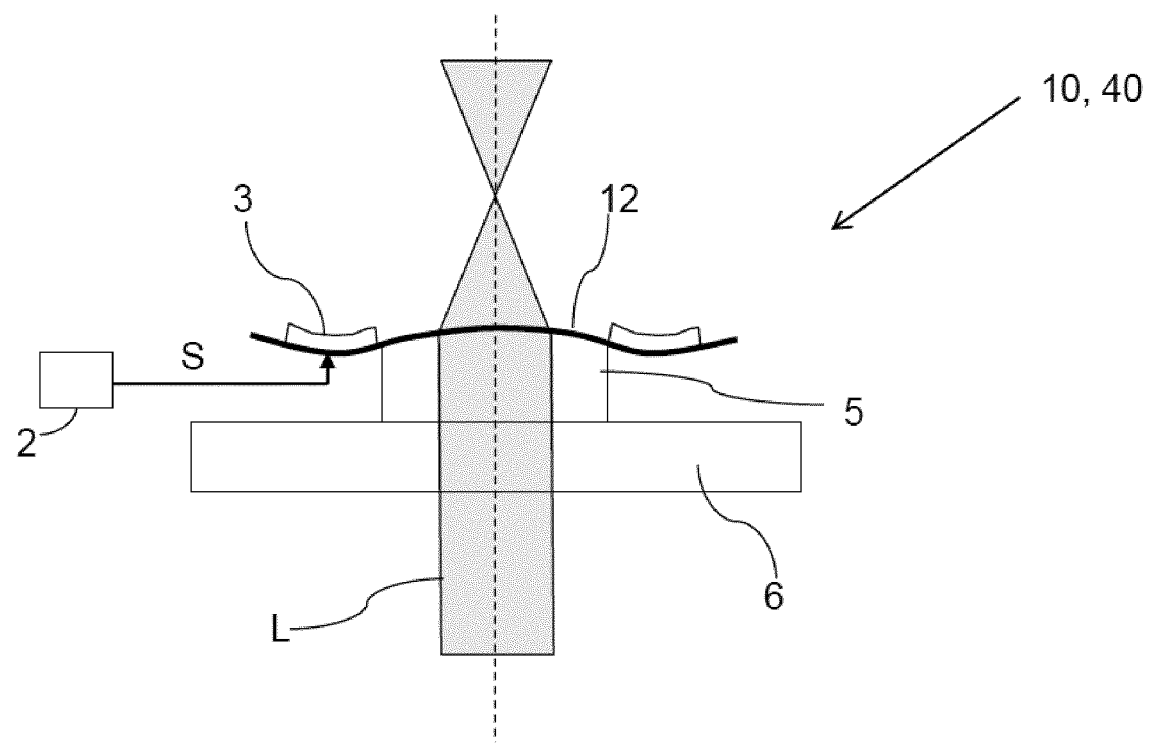
FIG. 14 shows a schematic representation of an embodiment of a first or second focus tunable lens in the form of a piezoelectric full polymer lens that can be used in an optical system according to the invention.

According to FIG. 14, the first focus tunable lens comprises an actuator means 3 in the form of a piezo actuator 3 for tuning the focal length of the first focus tunable lens 10, an elastically deformable membrane 12 (e.g. glass membrane) and a deformable polymer layer 5. Here, the membrane 12 is attached to the polymer layer 5 which may in turn be connected to a support (e.g. glass support) 6. Light L travelling through the support 6, the polymer layer 5 and the membrane 12 is refracted according to the curvature of the membrane 12 influencing the shape of the polymer layer 5, which curvature is adjusted by means of the piezo actuator 3 attached to the membrane 12.

Figure 15:
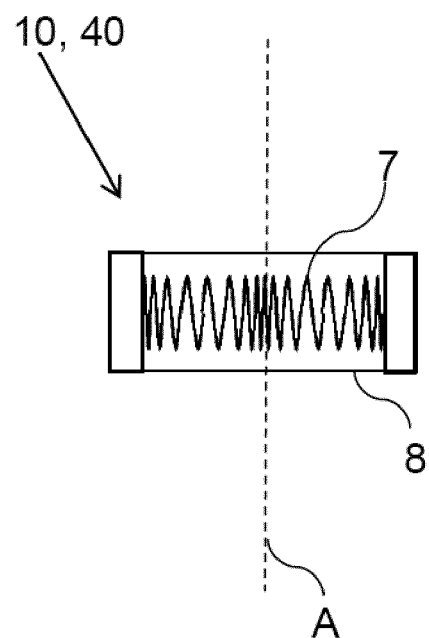
FIG. 15 shows a schematic representation of an embodiment of a first or second focus tunable lens in the form of an acoustooptical lens.

According to FIG. 15, the first focus tunable lens 10 may also be a known acoustooptical lens 10, wherein the focal length of the first lens 10 is controlled by means of sound waves 7, which induce density variations in a material 8 of the first lens 10 that then changes its index of refraction accordingly so that the focal length can be adjusted to a desired value.

Figure 16:
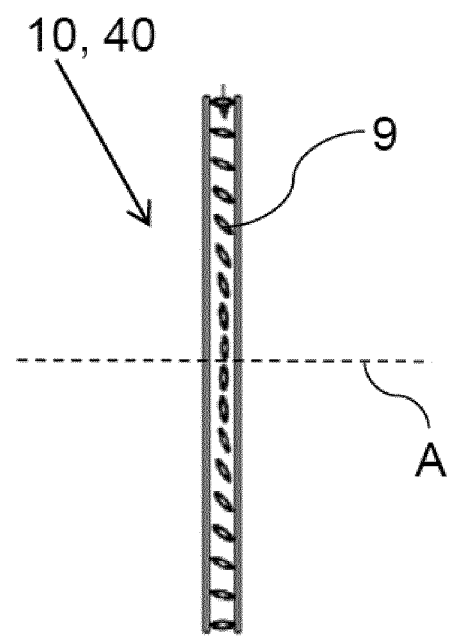
FIG. 16 shows a schematic representation of an embodiment of a first or second focus tunable lens comprising a liquid crystal for adjusting the focal length of the respective lens.

According to FIG. 16, the first focus tunable lens 10 may comprises a liquid crystal material 9 for adjusting the focal length of the first focus tunable lens 10 by locally changing the refractive index of the lens.

Figure 17:
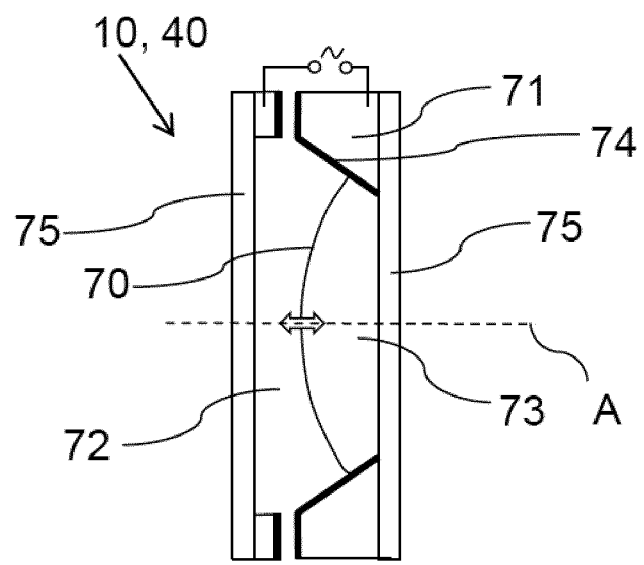
FIG. 17 shows a schematic representation of an embodiment of a first or second focus tunable lens in the form of an electrowetting lens.

According to FIG. 17 the first focus tunable lens 10 may use an electrowetting actuator 3 in order to change the focal length of the first lens 10. Here, the light may be refracted at a liquid-liquid interface 70 (e.g. water 72 and oil 73), wherein the curvature of said interface 70 is adjusted by means of an electrode 71 of the actuator 3 that influences the wetting of one of said liquids 73 (e.g. oil) on an electrically insulated surface 74 of the electrode 71 which leads to an adjustable curvature of said interface 70 and therefore to a tunable focal length depending on a voltage applied to said electrode 71. The liquids 72, 73 may be arranged between two parallel transparent plates 75 (e.g. glass plates).

Figure 18:
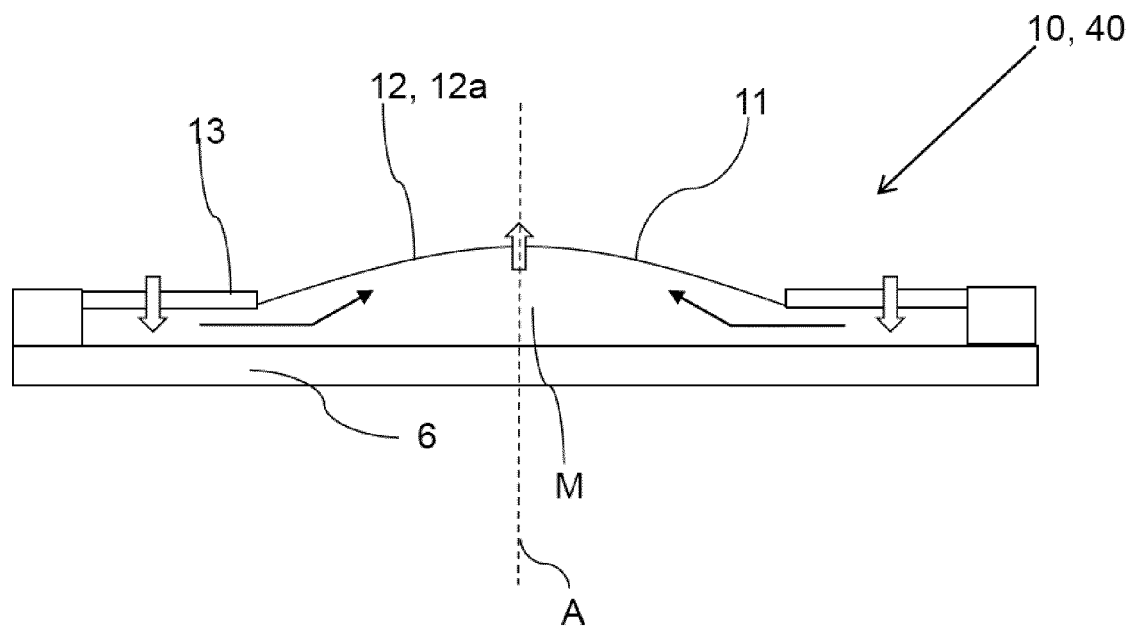
FIG. 18 shows a schematic representation of an embodiment of a first or second focus tunable lens in the form of an electrostatic membrane lens.

According to FIG. 18 the focal length of the first focus tunable lens may also be adjusted by means of an electrostatic actuator 3. Here, a lens shaping element 13 may be moved with respect to a support 6 of the first lens 10 by means of an electrostatic force thus moving filler material M (e.g. transparent liquid) in a lens body 11 of the first lens such that a curvature adjustable area 12a of a membrane 12 of the first lens 10 is adjusted accordingly.

Figure 19:
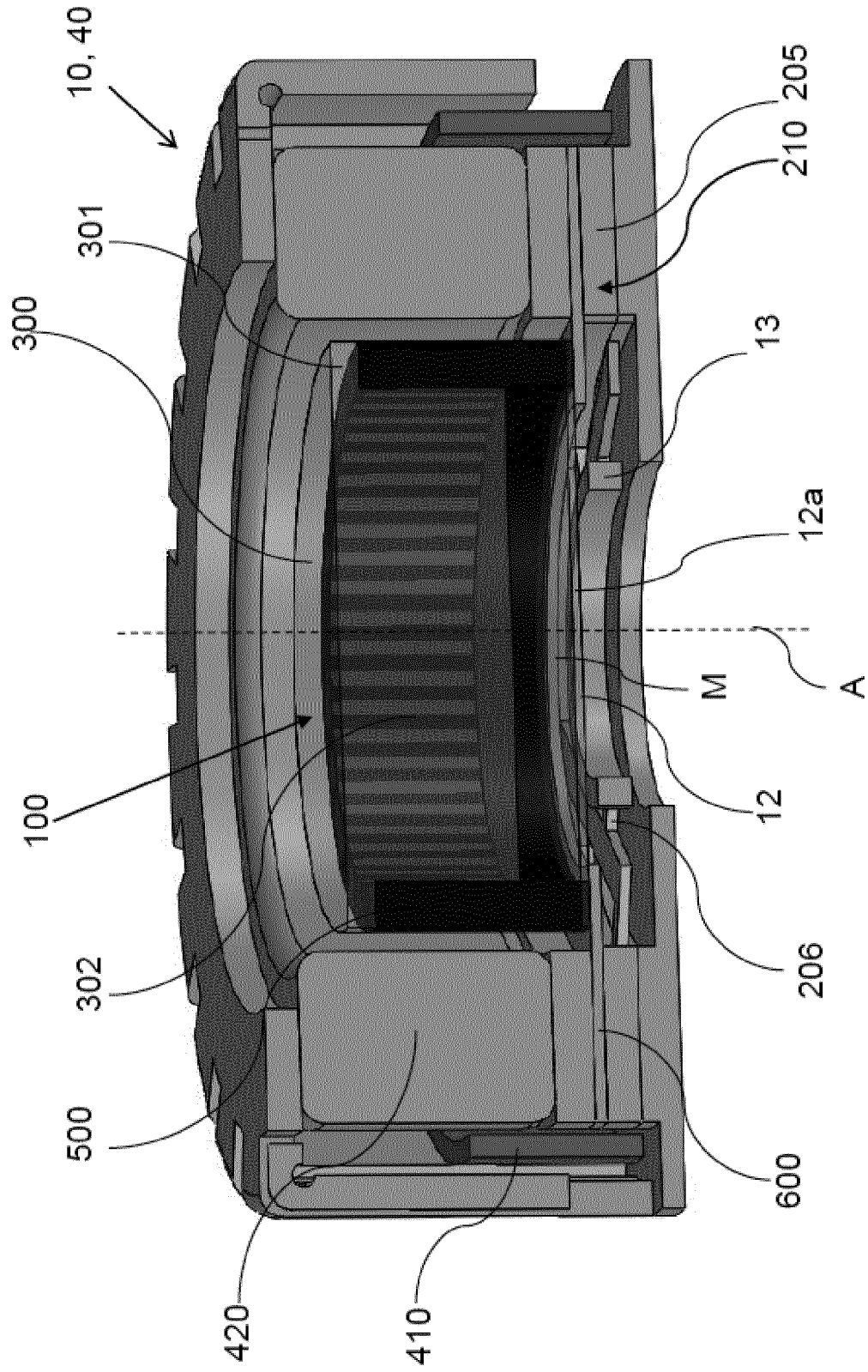
FIG. 19 a schematic representation of an embodiment of a first or second focus tunable lens comprising a thermal compensation means.

According to FIG. 19 the first focus tunable lens 10 or the optical system 1 may further comprise a thermal compensation means 300, 500, 13, 210 being configured to minimize thermal drift of the focal length of the first focus tunable lens 10.

For instance, FIG. 19 shows an embodiment of such a first focus tunable lens 10, which comprises a container 100 defining a volume which is filled with a transparent filler material M (e.g. a transparent liquid). The container 100 comprises a transparent and elastically deformable membrane 12, a transparent rigid member 300, as well as a ring member 500, wherein the membrane 12, the rigid member 300 and the ring member 500 delimit said volume.

Particularly, the ring member 500 rests on a base 301 of the rigid member 300 that extends perpendicular to the optical axis/direction A and encompasses a cylindrical protrusion 302 of the rigid member 300 that protrudes from the base 300 towards the membrane 12. In other words, this embodiment comprises a free standing ring member 500.

Both the transparent rigid member 300 and the membrane 12 extend along a fictitious extension plane and face each other in the direction A, wherein said direction A extends perpendicular to said extension plane, and wherein the filler material M is arranged between the membrane 12 and the rigid member 300. The ring member 500 forms a circumferential lateral wall of the container 100 that extends along said extension plane and comprises a height or dimension extending in said direction A. Particularly, the optical axis A forms a cylinder axis of the ring member 500.

Further, the ring member 500 comprises a circumferential face side facing away from the rigid member 300. The membrane 12 is attached to said face side with a boundary region of the membrane 12. Further, a lens shaping element 13, particularly in the form of an annular, particularly circular, member, is attached to the membrane 12 or contacts the membrane 12 along an e.g. circular line. Thus, the lens shaper 13 defines an area 12a (delimited by said line) which covers an opening of the lens shaper 13 and constitutes a curvature-adjustable area 12a of the membrane 12. In case the lens shaper 13 is a circular annular member said area 12a can assume a spherical curvature. Correspondingly, the first lens 10 is a spherical lens in this regard. Of course the lens shaper 13 may also comprise other contact lines for yielding other curvatures. Particularly, the ring member 500 and the lens shaper 13 may have a (hollow) cylindrical shape, respectively.

Further, the lens shaping element 13 (e.g. in the form of a cylindrical ring) forms part of a compliant lens-shaper structure 210 that gets softer over temperature so that it accomplishes a compensation of the thermal drift of the RI (refraction index).

In detail, this structure 210 comprises a circumferential carrier 205 to which the lens shaper 13 that is surrounded by the carrier 205 is coupled via spring members 206, wherein each spring member 206 forms or comprises a lever for moving the lens shaper 13 in the axial direction A of the first lens 10. The levers 206 are configured to be actuated with a coil 410 to axially move the lens shaper 13 for adjusting the curvature of a central area 12a of the membrane 12 defined by the lens shaping element 13.

Further, the container 100 comprising the rigid member 300, the ring member 500 and the membrane 12 is surrounded by a structure comprising a ring magnet 420 and a return structure 600 for guiding the magnetic flux of said coil 410, This structure 600 in turn is surrounded by said (voice) coil 410 which is connected to the levers 206.

During usage of the first lens 10, the temperature of the first lens 10 and therefore of the liquid M residing in said volume of the container 100 may change and particularly increase for various reasons. Such an increasing temperature leads to an increase of the volume of the liquid M and therefore to an increased (e.g. convex) curvature of said area 12a of the first lens 10 and thus to a decreasing focal length. Further, the refractive index (RI) of the liquid M may change (e.g. decrease) when the temperature changes (e.g. increases). Usually, the RI decreases when the temperature of the material (here liquid M) rises such that the focal power of the lens decreases, i.e. the focal length increases.

Therefore, the first lens 10 is configured to compensate such a thermal expansion of the liquid M and/or a change of the refractive index of the liquid M due to an increased temperature of the liquid M in order to reduce an unwanted thermally induced change of the focal length of the first lens 10.

Particularly, in order to accomplish a compensation of the thermal drift of the volume of the liquid M in the embodiment shown in FIG. 19, the ring member 500 comprises a comparably high linear coefficient of thermal expansion (CTE), e.g. similar or smaller than the linear coefficient of thermal expansion of the liquid M (which may be derived from the volumetric value), whereas the rigid member 300 comprises a smaller linear CTE than the liquid M and the ring member 500.

Therefore, in the radial direction that extends along said extension plane (i.e. perpendicular to the direction A), the rigid member 300 expands less than the liquid M due to the smaller linear CTE of the rigid member 300. Normally, this would lead to a change of the volume of the liquid container 100, wherein the increasing curvature of the area 12a of the membrane 12 caused by the increasing intrinsic volume of the liquid M (that increases faster than the actual volume of the container 100) causes an unwanted thermal change of the lens' focal power.

However, here, the ring member 500 is dimensioned such that its expansion in direction A due to an increasing temperature yields an increase of the volume of the container 100 that approximately corresponds to the increase of the volume of the liquid M. In this way, the curvature of said area 12a stays essentially constant when the temperature of the first lens 10 (particularly of liquid M) changes. Particularly, the dimension/height of the ring member 500 in direction A is larger than the height of the liquid M in the volume of the container 100 in the same direction A. Thus considering the linear expansion in direction A, the lateral wall (ring member) 500 of the container 100 of the lens 1 will expand more than the liquid M if their linear CTEs are equal for instance.

Particularly, in order to amplify the expansion of the ring member 500 in direction A with respect to the liquid M, the lateral expansion of the ring member 500 (i.e. in the radial direction) can be restricted by some suitable means. In this way, the expansion of the ring member 500 in direction A can be higher than the actual linear CTE, i.e. the thermal expansion of the ring member 500 in direction A can be amplified as needed. The ring member 500 may be formed out of a silicone while the rigid member 300 may be formed out of a polycarbonate.

Figure 2:
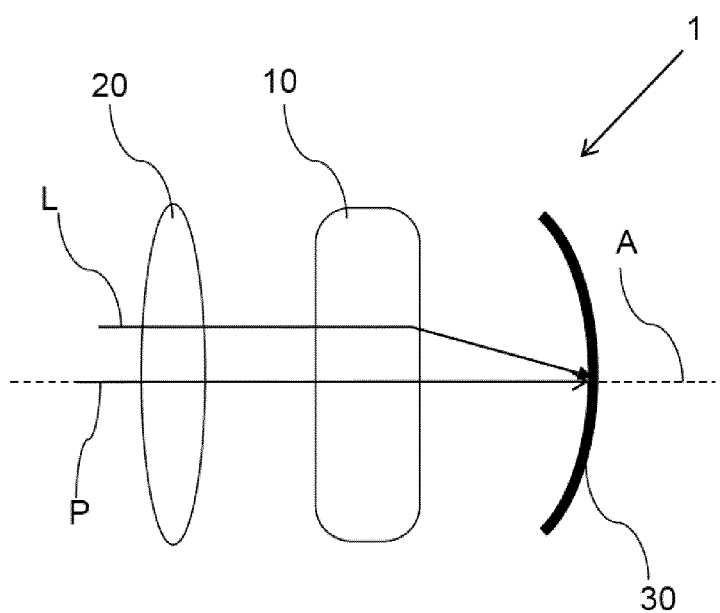
FIG. 2 shows a schematic representation of a modification of the optical system shown in FIG. 1, wherein the optical system comprises an additional corrective lens.

Further, FIG. 2 shows a schematic representation of a modification of the optical system shown in FIG. 1, wherein the optical system 1 now comprises an additional first corrective lens 20 being a non tunable lens that comprises a fixed position with respect to the image sensor 30 and is arranged along the optical path P or optical axis A in front of the first focus tunable lens 10 which may be configured as described in conjunction with FIG. 1. Thus, the first focus tunable lens 10 is arranged between the first corrective lens 20 and the image sensor 30 along the optical path P. Here, the fixed non-tunable first corrective lens 20 or several such lenses arranged one after the other in said optical path P is/are preferably configured to correct for one of monochromatic aberrations, spherical aberrations, or polychromatic aberrations.

Figure 3:
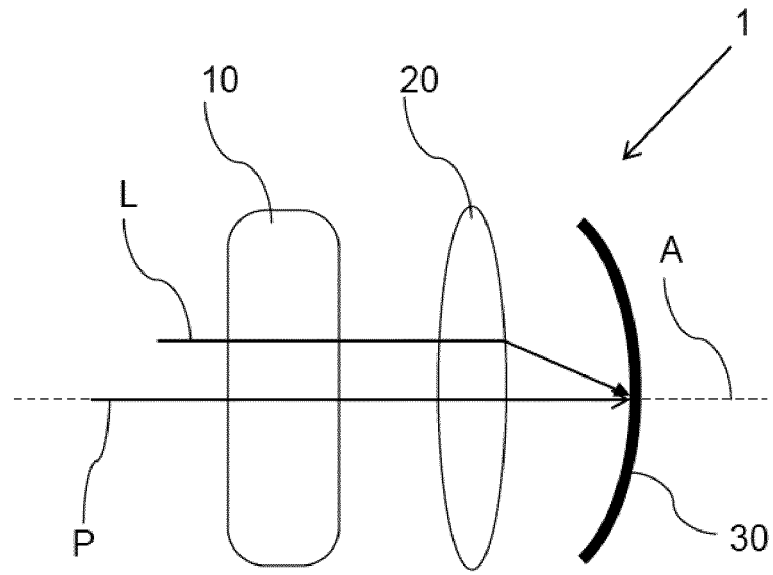
FIG. 3 shows a schematic representation of the modification of the optical system shown in FIG. 2 wherein the positions of the focus tunable lens and the corrective lens are interchanged.

Further, FIG. 3 shows a schematic representation of the modification of the optical system shown in FIG. 2 wherein the positions of the focus tunable lens 10 and the first corrective lens 20 are interchanged.

Figure 4:
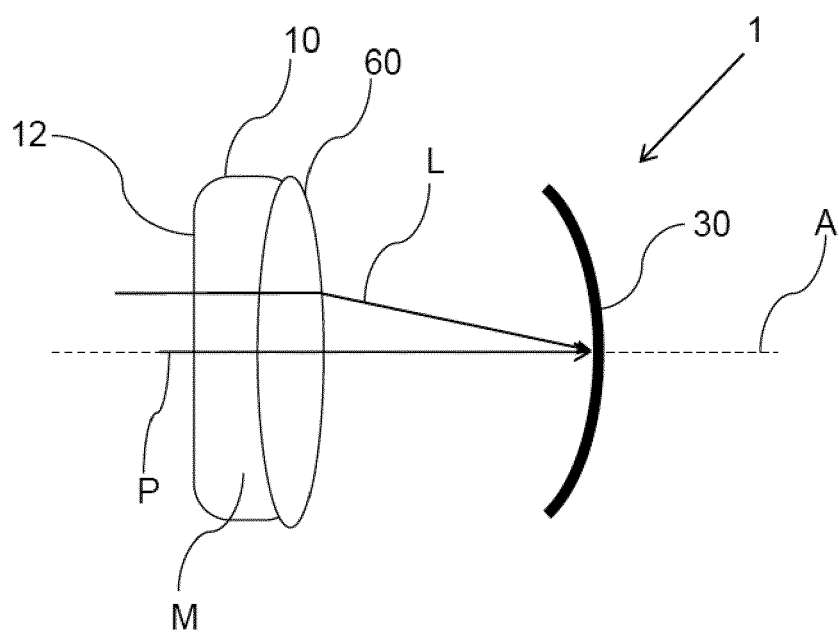
FIG. 4 shows a schematic representation of an optical system according to the invention comprising a first focus adjustable lens wherein a filler material of the first focus adjustable lens is in direct contact with a corrective lens of the optical system.

Further, FIG. 4 shows a schematic representation of an optical system 1 according to the invention comprising a first focus adjustable lens 10 wherein a transparent filler material M (e.g. said filler material described above, e.g. a transparent liquid) of the first focus adjustable lens 10 is in direct contact with a rigid corrective lens 60 of the optical system 1. Here, the first focus tunable lens 10 may be a lens as described in conjunction with FIG. 1 or another focus tunable lens 10 described herein said comprises a filler material M. As shown in FIG. 4, the corrective lens 60 is arranged between the first focus tunable lens 10 and the image sensor 30 along the optical path P, particularly between the filler material M and the image sensor 30.

Figure 5:
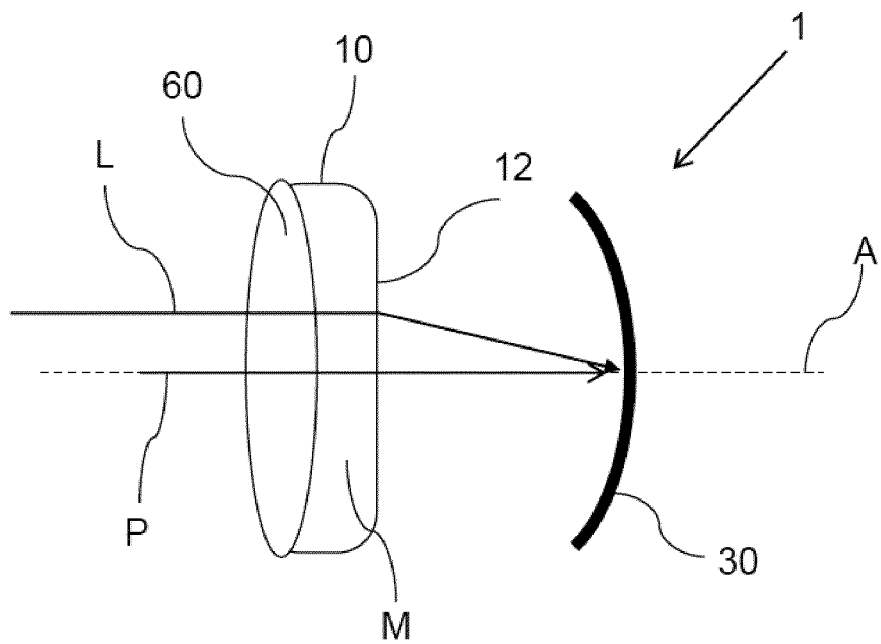
FIG. 5 shows a schematic representation of the optical system shown in FIG. 4, wherein the position of the focus tunable lens and the corrective lens are interchanged.

FIG. 5 shows a schematic representation of the optical system shown in FIG. 4, wherein the position of the first focus tunable lens 10 and the integrated rigid corrective lens 60 are interchanged. Here, the first tunable lens 10, i.e., the filler material M (e.g. transparent liquid) is arranged between the corrective lens 60 and the image sensor 30 along the optical path P of the system 1.

Further, particularly, while in FIG. 4 the membrane 12 that may be used for adjusting the focal length of the first lens 10 may face away from the image sensor 30, the membrane 12 of the first focus tunable lens 10 according to FIG. 5 may actually face the image sensor 30.

Further, in FIGS. 4 and 5, the corrective lens 60 is preferably configured to correct monochromatic, polychromatic or spherical aberrations.

Figure 6:
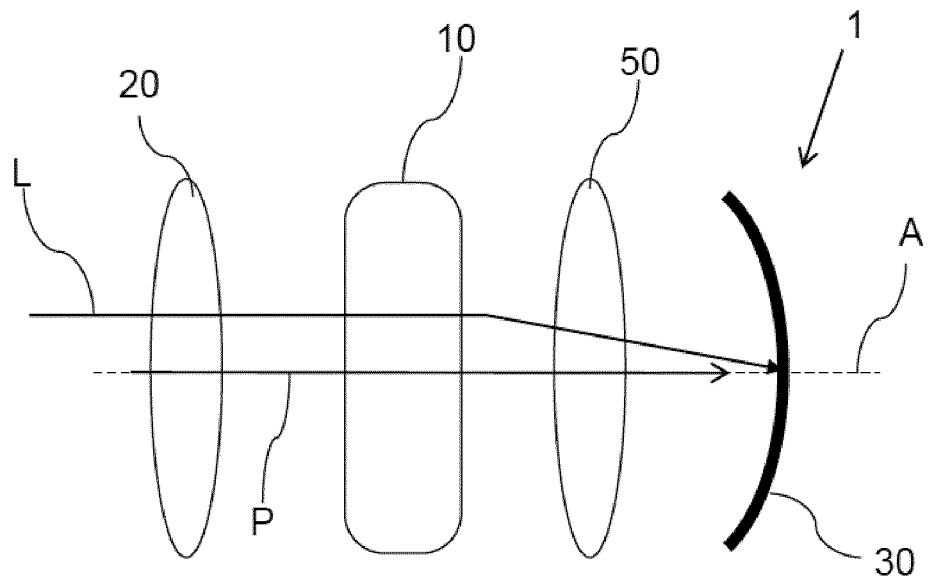
FIG. 6 shows a schematic representation of an optical system according to the invention comprising a first focus tunable lens and two corrective lenses.

FIG. 6 shows a schematic representation of an optical system according to the invention comprising a first focus tunable lens 10 and a first corrective lens 20 that may be configured as described in conjunction with FIGS. 1 and 2, wherein now an additional second corrective lens 50 that is non-tunable and comprises a fixed position with respect to the image sensor 30 is arranged along the optical path P between the first focus tunable lens 10 and the image sensor 30. Here, the first corrective lens 20 is preferably configured to correct monochromatic, polychromatic or spherical aberrations, wherein the second corrective lens 50 is preferably configured to correct monochromatic, polychromatic or spherical aberrations and field curvature.

Figure 7:
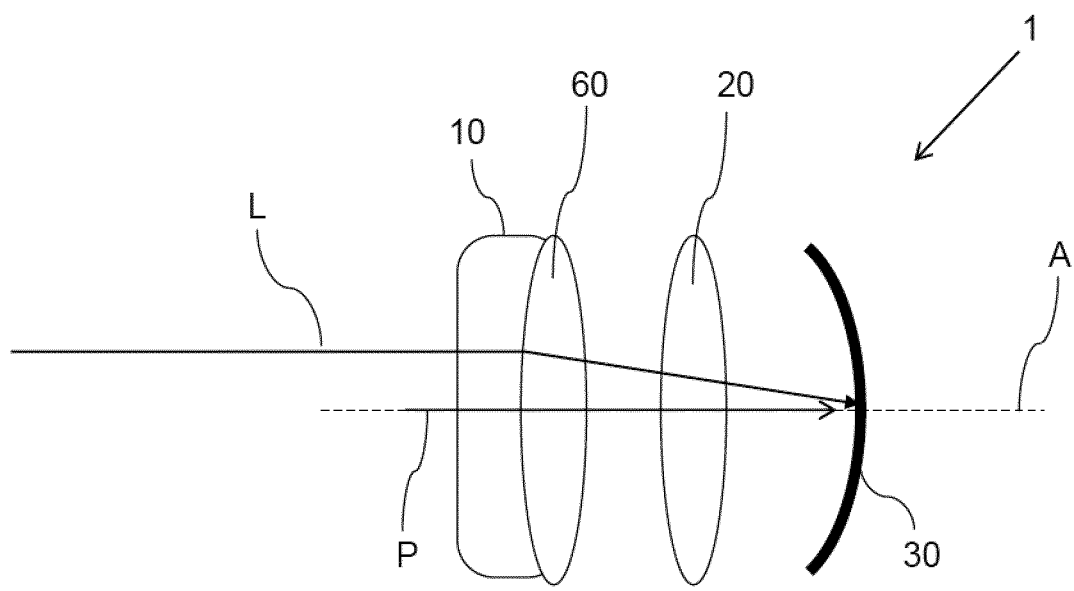
FIG. 7 shows a schematic representation of a modification of the optical system shown in FIG. 5, wherein a further corrective lens is arranged between the image sensor and the corrective lens that is in contact with the filler material.

Further, FIG. 7 shows a schematic representation of a modification of the optical system shown in FIG. 5, wherein a further first corrective lens or lenses 20 is/are arranged between the image sensor 30 and the corrective lens 60 that is in contact to the filler material M of the first focus tunable lens 10. Here, the corrective lens 60 is preferably configured to correct monochromatic, polychromatic or spherical aberrations, wherein the first corrective lens 20 is preferably configured to correct monochromatic, polychromatic or spherical aberrations and field curvature.

Figure 8:
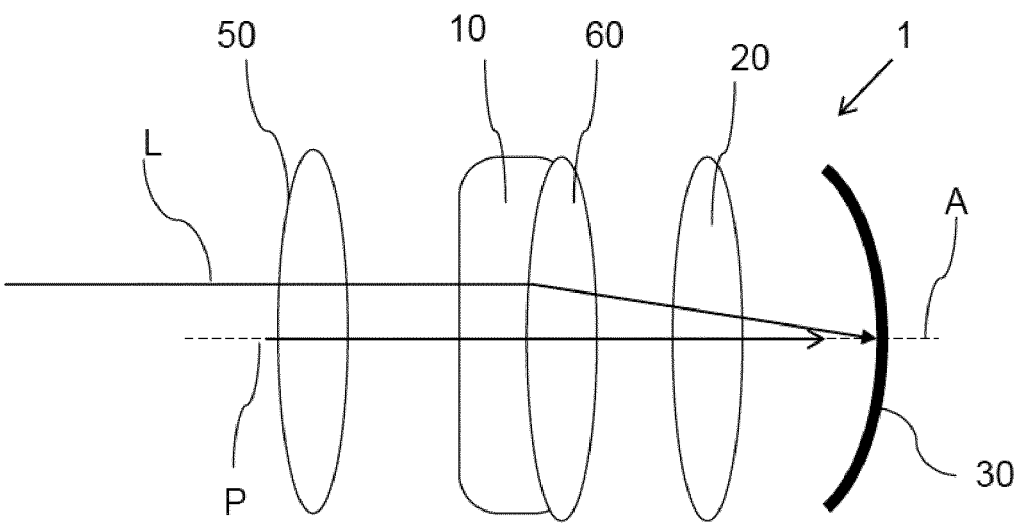
FIG. 8 shows a schematic representation of a further modification of the optical system shown in FIG. 7, wherein a further corrective lens is arranged in the optical path before the focus tunable lens.

Further, FIG. 8 shows a schematic representation of a further modification of the optical system 1 shown in FIG. 7, wherein a further second corrective lens 50 is arranged in the optical path P before the first focus tunable lens 10, i.e., the first focus tunable lens 10 (together with its corrective lens 60) is arranged between the second corrective lens 50 and the first corrective lens 20 which is closer to the image sensor 30 than the second corrective lens 50. Particularly, also the second corrective lens 50 is a fixed lens with respect to the image sensor 30 and is non-tunable, i.e. formed out of a rigid material (in contrast to the deformable filler material M, membrane 12, or polymer layer 5). Here, the corrective lens 60 is preferably configured to correct monochromatic, polychromatic or spherical aberrations, wherein the first corrective lens 20 is preferably configured to correct monochromatic, polychromatic or spherical aberrations and field curvature, and wherein the second corrective lens 50 is preferably configured to correct monochromatic, polychromatic or spherical aberrations.

Figure 9:
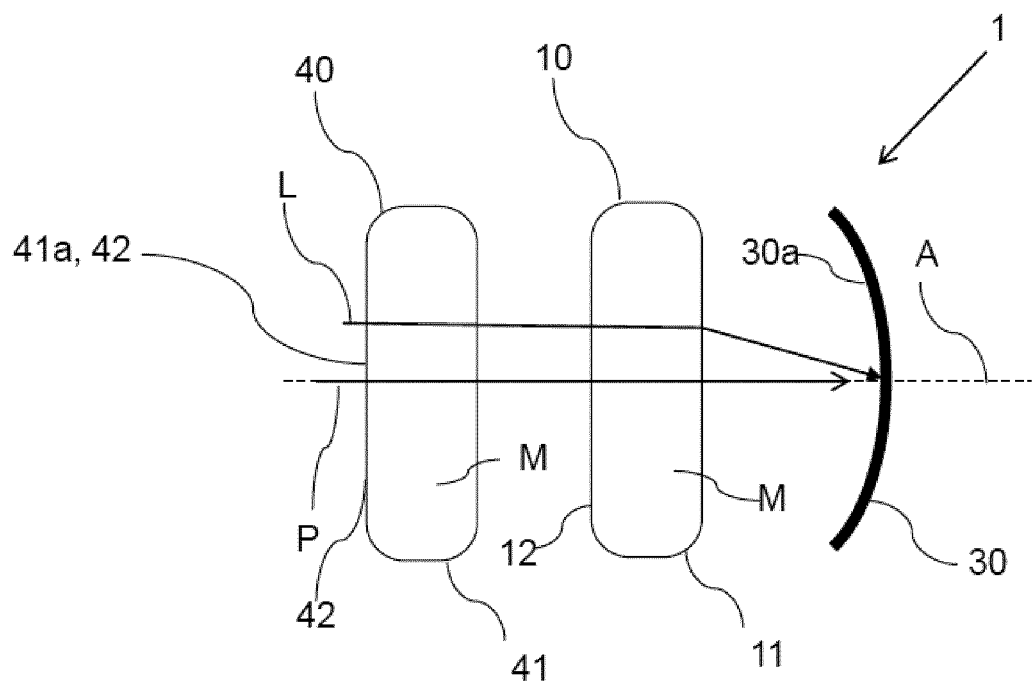
FIG. 9 shows a schematic representation of an optical system according to the invention comprising a first and a second focus tunable lens.

FIG. 9 shows a schematic representation of an optical system 1 according to the invention comprising a first focus tunable lens 10 as described in conjunction with FIG. 1 as well as a further second focus tunable lens 40 which may be configured as the first focus tunable lens 10 or as another focus tunable lens described herein (for instance in conjunction with FIGS. 14 to 19. Particularly, the second focus tunable lens 40 is also arranged in said optical path P, wherein the second focus tunable lens 40 is configured to operate with the first focus tunable lens 10 to focus light L traversing the optical path P onto the image sensor 30, particularly onto its curved detecting surface 30a. Further, also the second focus tunable lens 40 may comprise a lens body 41 arranged in the optical path P for refracting light L passing through the lens body 41, wherein said lens body 41 comprises at least one surface 41a arranged in said optical path P, which at least one surface 41a is configured to change shape for example from a convex shape to a concave shape or vice versa. Particularly said surface 41a may be formed by a membrane 42 as described in conjunction with the first focus tunable lens 10. Preferably the first focus tunable lens 10 is arranged closer to the image sensor 30 than the second focus tunable lens 40.

Figure 10:
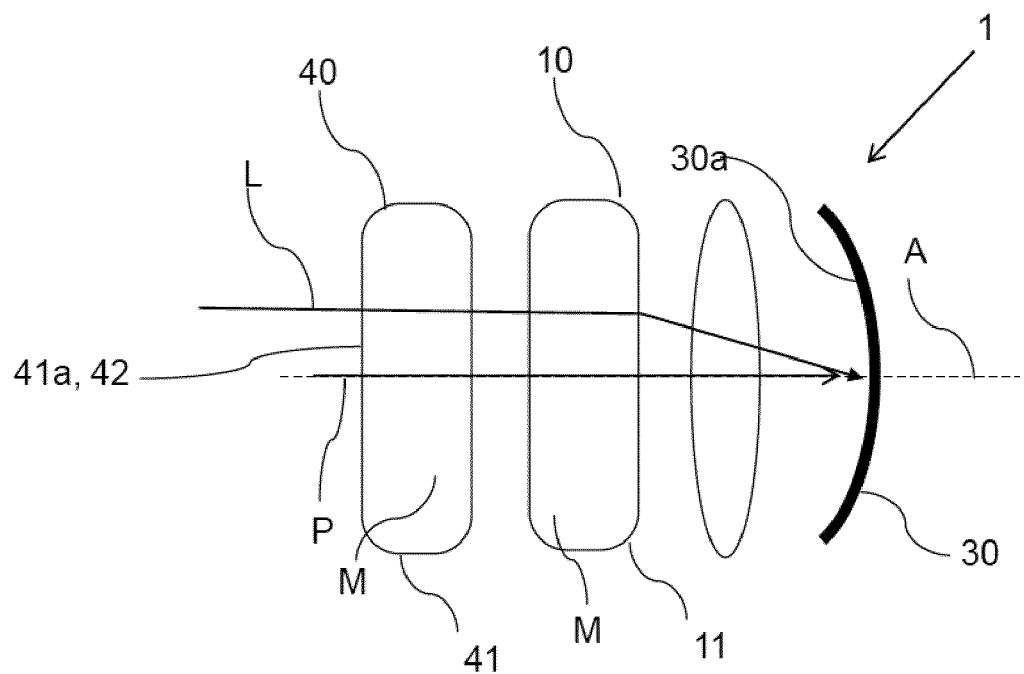
FIG. 10 shows a schematic representation of a modification of the optical system shown in FIG. 9, wherein a corrective lens is arranged between the image sensor and the first tunable lens.

Further, FIG. 10 shows a schematic representation of a modification of the optical system shown in FIG. 9, wherein a first corrective lens 20 is arranged between the image sensor and the first tunable lens 10. Here, said corrective lens 20 may comprise a fixed position with respect to the image sensor 30 and may be non-tunable, i.e., made out of a rigid material. Preferably, the first corrective lens 20 is configured to correct monochromatic, polychromatic or spherical aberrations.

Figure 11:
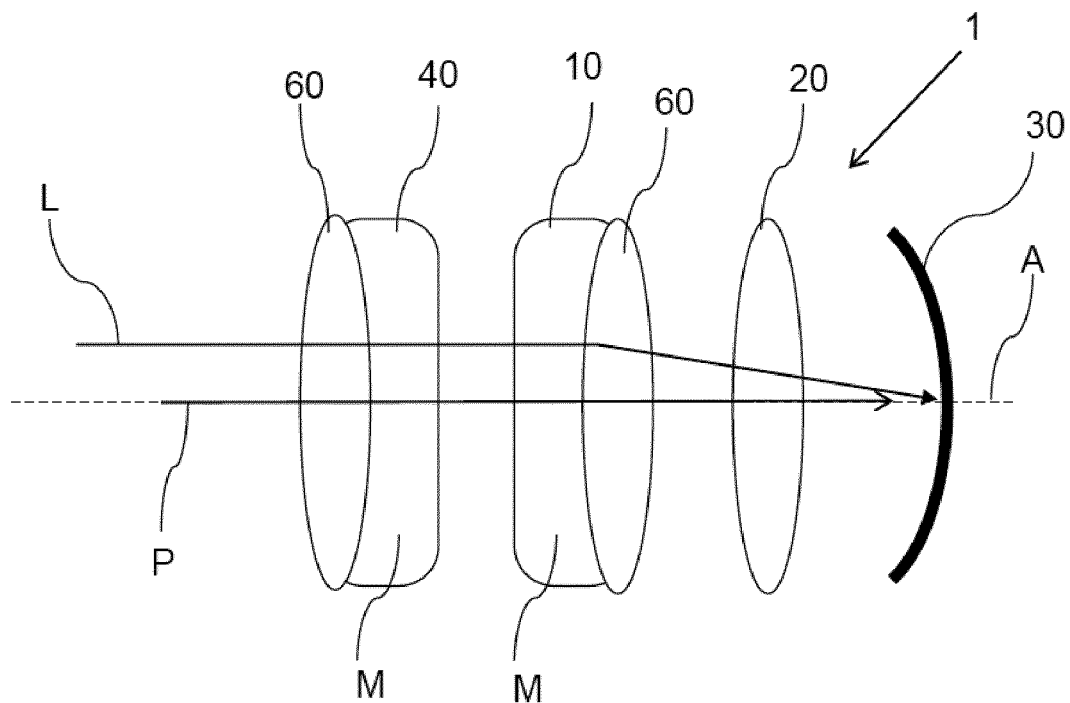
FIG. 11 shows a schematic representation of a modification of the optical system shown in FIG. 10, wherein both tunable lenses comprise a corrective lens being in direct contact with the respective filler material.

Further, FIG. 11 shows a schematic representation of a modification of the optical system 1 shown in FIG. 10, wherein both tunable lenses 10, 40 comprise a corrective lens 60 being in direct contact with the respective filler material M. Particularly, the respective corrective lenses 60 are each arranged on a side of the associated focus tunable lens 10 that faces away from the other focus tunable lens 10, 40.

Figure 12:
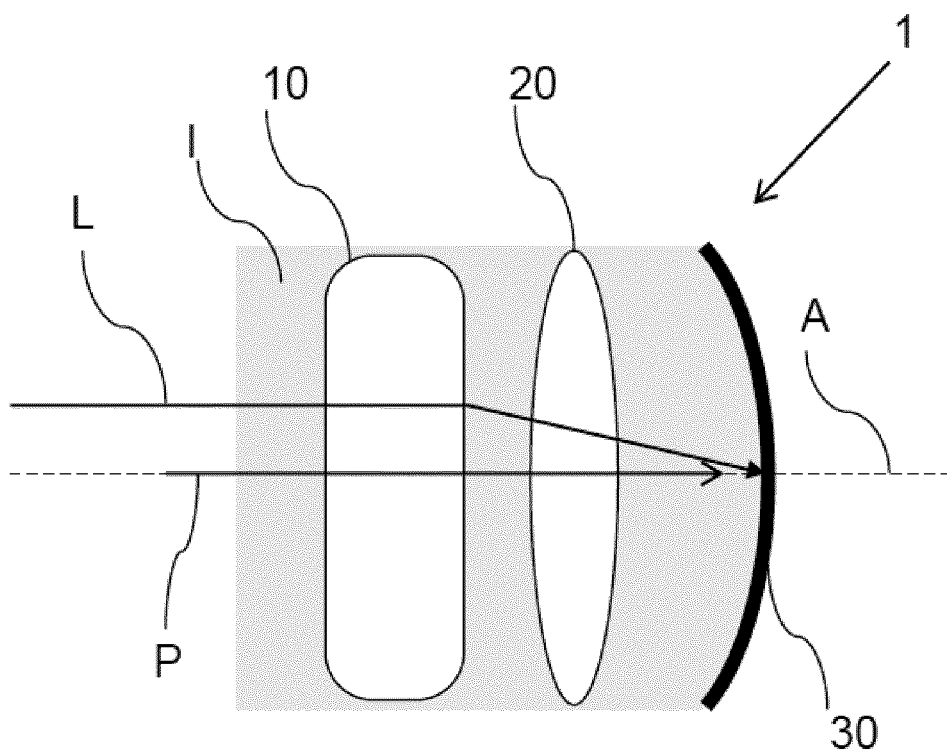
FIG. 12 shows a schematic presentation of a modification of the optical system shown in FIG. 3 wherein the two lenses are arranged in an immersive liquid.

Further, FIG. 12 shows a schematic presentation of a modification of the optical system shown in FIG. 3 wherein the two lenses of FIG. 3 are arranged in an immersive liquid I.

Figure 13:
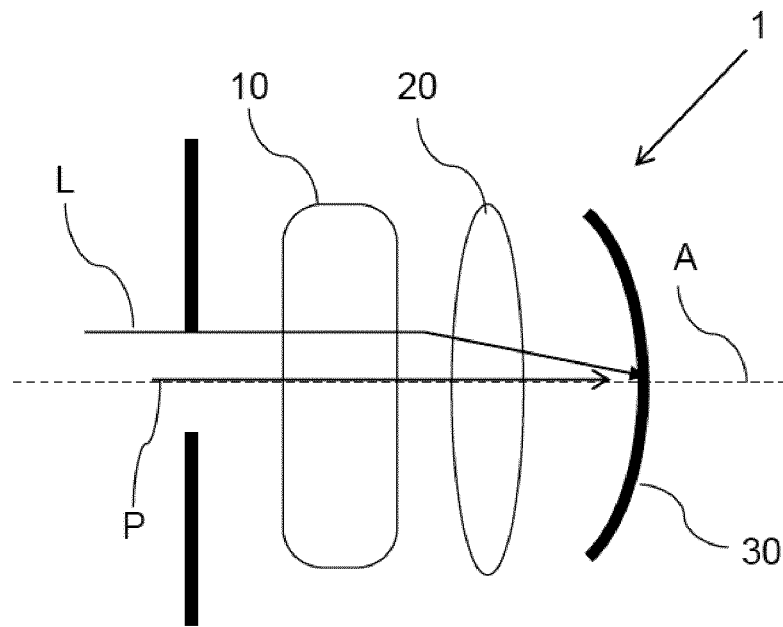
FIG. 13 shows a schematic representation of a modification of the optical system shown in FIG. 3, wherein the optical system comprises an aperture.

Further, FIG. 13 shows a schematic representation of a modification of the optical system 1 shown in FIG. 3, wherein the optical system 1 comprises an aperture A' that is arranged in the optical path P before the first tunable lens 10 so that the lenses 10, 20 are arranged between the aperture A' and the image sensor 30. The position of the aperture can be anywhere along the optical path P and it is also possible to have multiple apertures.

In the embodiments shown in FIGS. 1 to 19, particularly FIGS. 14 to 19, a control unit 2 (as shown in FIG. 14) may provide a suitable signal S for triggering and controlling the respective actuation means 3.

Additionally, in all embodiments that have one or multiple corrective lenses described herein, each corrective lens may consist of one lens or a group of lenses.

Further, all optical systems 1 described herein may be configured to adjust the focal length of the first and/or second focus tunable lens 10, 40 using an algorithm which uses calibration data, temperature (e.g. a temperature of the respective lens) or another feedback signal to set a corresponding value of a control signal (e.g. the electrical signal S) to achieve the desired focal length.

The invention claimed is:

1. An optical system (1) comprising: a first focus tunable lens (10), a curved image sensor (30) configured to receive light (L) focused by the first focus tunable lens (10); an optical path (P) extending through the first focus tunable lens and to the curved image sensor; wherein the optical system (1) is configured to tune the focal length of the first focus tunable lens (10) by applying an electrical signal to the first focus tunable lens (10) such that light (L) traversing said optical path (P) is focused onto the image sensor (30); the first focus tunable lens (10) comprises a membrane (12) having a deformable portion (12a), a filler material (M) adjacent said membrane (12), and a corrective lens (60) comprising a fixed position with respect to the image sensor (30): wherein the corrective lens (60) contacts the filler material (M) of the first focus tunable lens (10), and is configured to correct monochromatic or polychromatic aberrations.

2. The optical system of claim 1, characterized in that the optical system (1) further comprises a second focus tunable lens (40), wherein the second focus tunable lens (40) is arranged in said optical path (P), and wherein the second focus tunable lens (40) is configured to operate with the first focus tunable lens (10) to focus light (L) traversing the optical path (P) onto the image sensor (30).

3. The optical system of claim 2, characterized in that the first focus tunable lens (10) and/or the second focus tunable lens (40) each comprise one of the following components configured for tuning the respective focal length: an actuator means (3), an electrostatic actuator means, an electromagnetic actuator means, a magnetostrictive actuator means, a piezo actuator means, a piezo motor, a stepper motor, an electroactive polymer actuator means.

4. The optical system of claim 1, characterized in that the first focus tunable lens (10) comprises a lens body (11) arranged in the optical path (P) for refracting light (L) passing through the lens body (11), wherein said lens body (11) comprises at least one surface (11a) arranged in said optical path (P), which at least one surface (11a) is configured to change its shape, particularly from a concave shape to a convex shape or vice versa.

5. The optical system of claim 2, characterized in that the second focus tunable lens (40) comprises a lens body (41) arranged in the optical path (P) for refracting light (L) passing through the lens body (41), wherein said lens body (41) comprises at least one surface (41a) arranged in said optical path (P), which at least one surface (41a) is configured to change its shape, particularly from a convex shape to a concave shape or vice versa.

6. The optical system of claim 1, characterized in that the corrective lens (60) is made out of a rigid material.

7. The optical system of claim 1, characterized in that the first focus tunable lens (10) comprises a liquid crystal (9) for adjusting the focal length of the first focus tunable lens (10), and/or wherein a second focus tunable lens (10, 40) comprises a liquid crystal (9) for adjusting the focal length of the second focus tunable lens (40).

8. The optical system of claim 1, characterized in that the first focus tunable lens (10) is configured to use electrowetting for adjusting the focal length of the first focus tunable lens (10), and/or wherein a second focus tunable lens (40) is configured to use electrowetting for adjusting the focal length of the second focus tunable lens (40).

9. The optical system of claim 1, characterized in that the first focus tunable lens (10) comprises a piezo actuator means (3) for tuning the focal length of the first focus tunable lens (10), a glass membrane (12) and a deformable polymer layer (5); and/or wherein a second focus tunable lens (40) comprises a piezo actuator means (3) for tuning the focal length of the second focus tunable lens (40), a glass membrane (12) and a deformable polymer layer (5).

10. The optical system of claim 1, characterized in that the first focus tunable lens (10) comprises a thermal compensation means (100, 300, 500, 13, 210) being configured to minimize thermal drift of the focal length of the first focus tunable lens (10); and/or wherein a second focus tunable lens (40) comprises a thermal compensation means (100, 300, 500, 13, 210) being configured to minimize thermal drift of the focal length of the second focus tunable lens (40).

11. The optical system of claim 1, characterized in that optical system (1) is configured to adjust the focal length of the first and/or a second focus tunable lens (10, 40) using an algorithm which uses calibration data, temperature or another feedback signal to set a value of a control signal (S) to achieve the desired focal length.

12. An optical system (1) comprising:
a first focus tunable lens (10),
a curved image sensor (30) configured to receive light (L) focused by the first focus tunable lens (10); an optical path (P) extending through the first focus tunable lens and to the curved image sensor;
wherein the optical system (1) is configured to tune the focal length of the first focus tunable lens (10) by applying an electrical signal to the first focus tunable lens (10) such that light (L) traversing said optical path (P) is focused onto the image sensor (30);
wherein the optical system (1) further comprises at least one first corrective lens (20) arranged in the optical path (P), which at least one first corrective lens (20) is non-tunable and comprises a fixed position with respect to the image sensor (30) and is made out of a rigid material, preferably a material having a fixed refractive index, and wherein the at least one first corrective lens (20) is configured to correct for one of monochromatic aberrations, spherical aberrations, or polychromatic aberrations.

13. An optical system (1) comprising:
a first focus tunable lens (10),
a curved image sensor (30) configured to receive light (L) focused by the first focus tunable lens (10); an optical path (P) extending through the first focus tunable lens and to the curved image sensor;
wherein the optical system (1) is configured to tune the focal length of the first focus tunable lens (10) by applying an electrical signal to the first focus tunable lens (10) such that light (L) traversing said optical path (P) is focused onto the image sensor (30);
wherein the optical system (1) further comprises a second corrective lens (50) arranged in the optical path (P), which second corrective lens (50) is non-tunable and comprises a fixed position with respect to the image sensor (30) and is made out of a rigid material, preferably a material having a fixed refractive index, and wherein the second corrective lens (50) is arranged between the image sensor (30) and the first focus tunable lens (10), wherein preferably the first focus tunable lens (10) is arranged closer to the image sensor (30) than the second focus tunable lens (40).

* * * * *